(12) United States Patent
Yang et al.

(10) Patent No.: US 11,462,592 B2
(45) Date of Patent: Oct. 4, 2022

(54) ARRAY SUBSTRATE WITH PIXEL CIRCUITS SHARING VOLTAGE CONTROL CIRCUIT, DRIVING METHOD, ORGANIC LIGHT EMITTING DISPLAY PANEL AND DISPLAY DEVICE

(71) Applicant: BOE Technology Group Co., Ltd., Beijing (CN)

(72) Inventors: Shengji Yang, Beijing (CN); Xue Dong, Beijing (CN); Xiaochuan Chen, Beijing (CN); Hui Wang, Beijing (CN); Shengnan Li, Beijing (CN); Zengqiang Zheng, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 152 days.

(21) Appl. No.: 16/650,601

(22) PCT Filed: Oct. 14, 2019

(86) PCT No.: PCT/CN2019/111072
§ 371 (c)(1),
(2) Date: Mar. 25, 2020

(87) PCT Pub. No.: WO2020/078326
PCT Pub. Date: Apr. 23, 2020

(65) Prior Publication Data
US 2021/0233968 A1 Jul. 29, 2021

(30) Foreign Application Priority Data

Oct. 18, 2018 (CN) .......................... 201811215357.6

(51) Int. Cl.
*H01L 29/08* (2006.01)
*H01L 27/32* (2006.01)
*G09G 3/3258* (2016.01)

(52) U.S. Cl.
CPC ....... *H01L 27/3218* (2013.01); *G09G 3/3258* (2013.01); *H01L 27/3262* (2013.01);
(Continued)

(58) Field of Classification Search
CPC ............. H01L 27/3218; H01L 27/3262; H01L 27/3276; H01L 27/3265; G09G 3/3258; G09G 2310/0286
(Continued)

(56) References Cited

U.S. PATENT DOCUMENTS

| 2006/0267050 A1 | 11/2006 | Tang |
| 2010/0039411 A1* | 2/2010 | Yatabe ................. G09G 3/3233 345/204 |

(Continued)

FOREIGN PATENT DOCUMENTS

| CN | 1632850 A | 6/2005 |
| CN | 1741116 A | 3/2006 |

(Continued)

OTHER PUBLICATIONS

Indian Office Action for 202027048073 dated Aug. 30, 2021.
Chinese Office Action for 201811215357.6 dated Oct. 25, 2019.

*Primary Examiner* — Phuc T Dang
(74) *Attorney, Agent, or Firm* — ArentFox Schiff LLP; Michael Fainberg

(57) ABSTRACT

An array substrate, a driving method, an organic light emitting display panel and a display device. The array substrate includes a plurality of light emitting devices and pixel circuits connected with the light emitting devices, both located in a display area as well as a plurality of voltage control circuits located in a non-display area, wherein at least two of the pixel circuits in one row share one of the voltage control circuits.

19 Claims, 11 Drawing Sheets

(52) U.S. Cl.
CPC ...... *H01L 27/3265* (2013.01); *H01L 27/3276* (2013.01); *G09G 2310/0286* (2013.01)

(58) Field of Classification Search
USPC .......................................................... 257/40
See application file for complete search history.

(56) References Cited

U.S. PATENT DOCUMENTS

| | | |
|---|---|---|
| 2013/0328753 A1 | 12/2013 | Tsuge |
| 2016/0300532 A1 | 10/2016 | Tan et al. |
| 2016/0351121 A1 | 12/2016 | Kim et al. |
| 2017/0150078 A1* | 5/2017 | Ukai ...................... H04N 5/369 |
| 2017/0162114 A1* | 6/2017 | Ono ...................... G09G 3/3233 |
| 2018/0151125 A1 | 5/2018 | Lee |
| 2019/0035817 A1* | 1/2019 | Park ........................ H01L 33/42 |
| 2019/0181206 A1* | 6/2019 | Cao ...................... H01L 51/5092 |
| 2021/0097938 A1 | 4/2021 | Wu et al. |

FOREIGN PATENT DOCUMENTS

| | | | |
|---|---|---|---|
| CN | 103403787 | A | 11/2013 |
| CN | 104036724 | A | 9/2014 |
| CN | 106205493 | A | 12/2016 |
| CN | 107103878 | A | 8/2017 |
| CN | 108257550 | A | 7/2018 |
| CN | 108417178 | A | 8/2018 |
| CN | 109036279 | A | 12/2018 |
| KR | 20080034663 | A | 4/2008 |

* cited by examiner

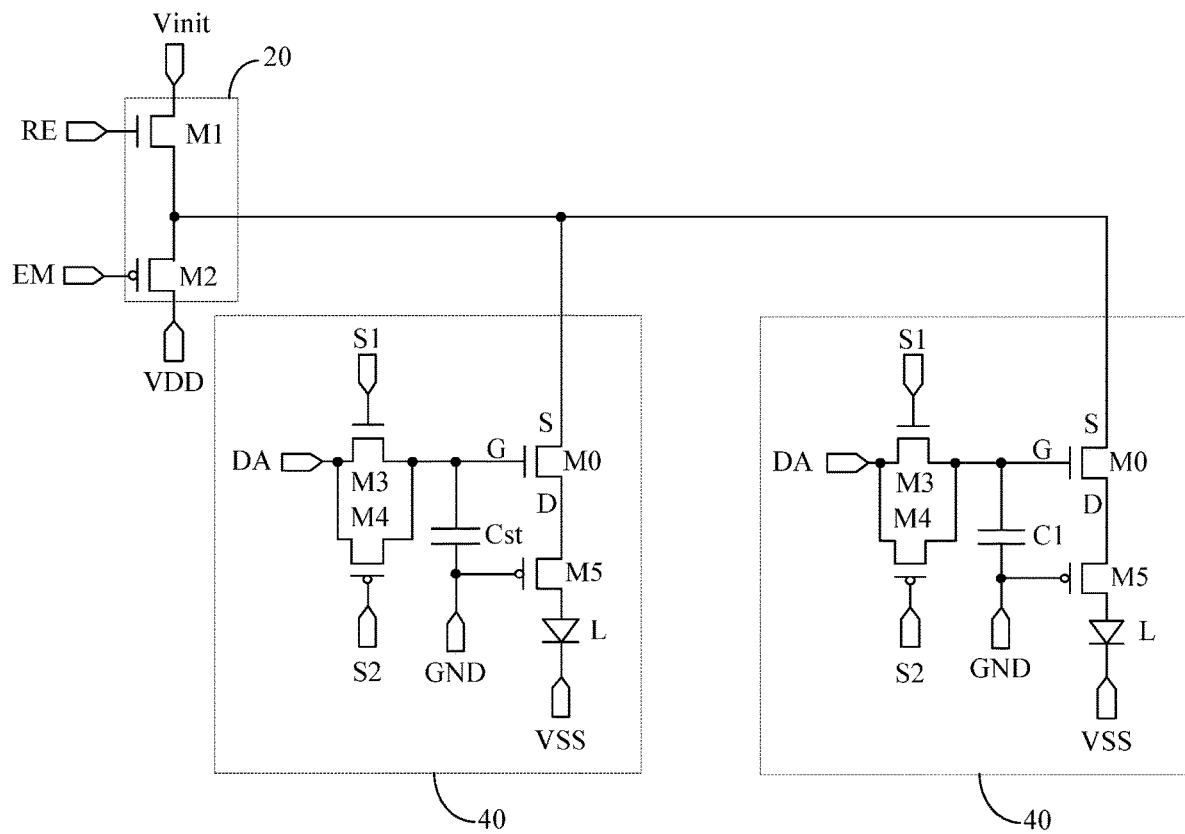

Fig. 5

S601 — in a reset stage, outputting, by the voltage control circuits, initialization signals to first electrodes of driving transistors in response to reset control signals so as to control the corresponding light emitting devices to be reset S602 — in a data writing stage, outputting data signals to gates of the driving transistors S603 — in a light emitting stage, outputting, by the voltage control circuits, first power signals to the first electrodes of the driving transistors in response to light emitting control signals so as to drive the light emitting devices to emit light

Fig. 6

ARRAY SUBSTRATE WITH PIXEL CIRCUITS SHARING VOLTAGE CONTROL CIRCUIT, DRIVING METHOD, ORGANIC LIGHT EMITTING DISPLAY PANEL AND DISPLAY DEVICE

CROSS REFERENCE TO RELATED APPLICATIONS

This application is a National Stage of International Application No. PCT/CN2019/111072, filed on Oct. 14, 2019, which claims the priority to the Chinese Patent Application No. 201811215357.6, filed to China National Intellectual Property Administration on Oct. 18, 2018 and entitled "ARRAY SUBSTRATE, DRIVING METHOD, ORGANIC LIGHT EMITTING DISPLAY PANEL AND DISPLAY DEVICE", all of which are incorporated in this application by reference.

FIELD

The present disclosure relates to the technical field of display and in particular to an array substrate, a driving method, an organic light emitting display panel and a display device.

BACKGROUND

An OLED (Organic Light Emitting Diode) display panel is one of hotspots in the research field of flat panel displays nowadays, and compared with an LCD (Liquid Crystal Display), an OLED display has the advantages such as low energy consumption, low production cost, self-illumination, wide viewing angle and high response speed.

SUMMARY

An embodiment of the present disclosure provides an array substrate, including:
  a plurality of light emitting devices being located in a display area;
  pixel circuits being located in the display area and being coupled with the light emitting devices, and the pixel circuits including driving transistors; and
  a plurality of voltage control circuits being located in a non-display area; and at least two of the pixel circuits sharing one of the voltage control circuits, and in one row of pixel circuits, first electrodes of the driving transistors being coupled with the shared voltage control circuit, and second electrodes of the driving transistors being coupled with the corresponding light emitting devices.

Optimally, in the embodiment of the present disclosure, the array substrate further includes: a plurality of pixel units located in the display area, and the pixel units respectively includes a plurality of sub-pixels; and the sub-pixels respectively includes one of the light emitting devices and one of the pixel circuits.

Optimally, in the embodiment of the present disclosure, the pixel circuits are arranged in a plurality of rows, and the pixel circuits in at least two of the adjacent sub-pixels in the same row share one of the voltage control circuits.

Optimally, in the embodiment of the present disclosure, all the pixel circuits in the same row share one of the voltage control circuits.

Optimally, in the embodiment of the present disclosure, the voltage control circuits respectively include: a first switching transistor; and
  a gate of the first switching transistor is configured to receive a reset control signal, a first electrode of the first switching transistor is configured to receive an initialization signal, and a second electrode of the first switching transistor is coupled with first electrodes of corresponding driving transistors.

The voltage control circuits further respectively include: a second switching transistor; and
  a gate of the second switching transistor is configured to receive a light emitting control signal, a first electrode of the second switching transistor is configured to receive a first power signal, and a second electrode of the second switching transistor is coupled with the first electrodes of corresponding driving transistors.

Optimally, in the embodiment of the present disclosure, the pixel circuits respectively further include: a third switching transistor and a storage capacitor;
  a gate of the third switching transistors is configured to receive a first gate scanning signal and is coupled with a first gate driving circuit, a first electrode of the third switching transistor is configured to receive a data signal, and a second electrode of the third switching transistor is coupled with a gate of a corresponding driving transistor; and
  a first end of the storage capacitor is coupled with the gate of the corresponding driving transistor, and a second end of the storage capacitor is coupled with a grounding end.

Optimally, in the embodiment of the present disclosure, the pixel circuits respectively further comprise: a fourth switching transistor, wherein a type of the fourth switching transistor is different from a type of the third switching transistor; and
  a gate of the fourth switching transistor is configured to receive a second gate scanning signal and is coupled with a second gate driving circuit, a first electrode of the fourth switching transistor is configured to receive a data signal, and a second electrode of the fourth switching transistor is coupled with the gate of the corresponding driving transistor.

Optimally, in the embodiment of the present disclosure, the pixel circuits respectively further comprise: a fifth switching transistor, wherein the second electrodes of the driving transistors are coupled with corresponding light emitting devices through the fifth switching transistor; and
  a gate of the fifth switching transistor is coupled with a reference signal end, a first electrode of the fifth switching transistor is coupled with a second electrode of a corresponding driving transistor, and a second electrode of the fifth switching transistor is coupled with a corresponding light emitting device.

Optimally, in the embodiment of the present disclosure, the fifth switching transistor is a P-type transistor, and the reference signal end is a grounding end.

Optimally, in the embodiment of the present disclosure, the array substrate further includes a plurality of light emitting control signal lines and a light emitting control circuit electrically connected with the light emitting control signal lines, wherein the light emitting control signal lines are electrically connected with the voltage control circuit electrically connected with one row of pixel circuits and is configured to input the light emitting control signals to the electrically connected voltage control circuit.

Optimally, in the embodiment of the present disclosure, the light emitting control circuit includes a plurality of cascaded light emitting shift registers, and the light emitting shift registers is electrically connected with one of the light emitting control signal lines respectively.

Optimally, in the embodiment of the present disclosure, the array substrate further includes: one first power signal line, wherein the first power signal line is electrically connected with the voltage control circuits and is configured to input the first power signals the voltage control circuits; or the array substrate further includes: a plurality of first power signal lines, wherein one of the light emitting control signal lines is electrically connected with the voltage control circuit electrically connected with one row of pixel circuits and is configured to input the first power signal to the electrically connected voltage control circuit.

Accordingly, an embodiment of the present disclosure further provides an organic light emitting display panel, including the array substrate provided by the embodiment of the present disclosure.

Accordingly, an embodiment of the present disclosure further provides a display device, including the organic light emitting display panel provided by the embodiment of the present disclosure.

Accordingly, an embodiment of the present disclosure further provides a driving method configured for the array substrate provided by the embodiment of the present disclosure, including: controlling voltage control circuits and pixel circuits to drive light emitting devices to work within one-frame display time, wherein driving one row of light emitting devices to work includes:

in a reset stage, outputting, by the voltage control circuits, initialization signals to first electrodes of driving transistors in response to reset control signals so as to control corresponding light emitting devices to be reset;

in a data writing stage, outputting data signal to gates of the driving transistors; and in a light emitting stage, outputting, by the voltage control circuits, first power signals to the first electrodes of the driving transistors in response to light emitting control signals so as to drive the light emitting devices to emit light.

Optimally, in the embodiment of the present disclosure, after the light emitting stage, driving one row of light emitting devices to work further includes: a non-light-emitting stage; and in the non-light-emitting stage, disconnecting, by the voltage control circuits, the first power signals from the first electrodes of the driving transistors in response to the light emitting control signals so as to control the corresponding pixel circuits to drive the connected light emitting devices to stop emitting light.

Optimally, in the embodiment of the present disclosure, non-light-emitting stages of driving rows of light emitting devices to work are started at a same time within the one-frame display time; or non-light-emitting stages of driving rows of light emitting devices to work are sequentially started row by row within the one-frame display time.

Optimally, in the embodiment of the present disclosure, after the light emitting stage, the driving one row of light emitting devices to work further includes: a dimming stage; the dimming stage includes: at least one non-light-emitting stage and at least one light emitting stage, wherein the non-light-emitting stage and the light emitting stage are sequentially and alternately arranged;

in the non-light-emitting stage, disconnecting, by the voltage control circuits, the first power signals from the first electrodes of the driving transistors in response to the light emitting control signals so as to control the corresponding pixel circuits to drive the connected light emitting devices to stop emitting light; and in the light emitting stage, outputting, by the voltage control circuits, the first power signals to the first electrodes of the driving transistors in response to the light emitting control signals so as to control the corresponding pixel circuits to drive the connected light emitting devices to emit light.

Optimally, in the embodiment of the present disclosure, dimming stages of driving rows of light emitting devices to work are started at a same time within the one-frame display time; or dimming stages of driving rows of light emitting devices to work are sequentially started row by row within the one-frame display time.

BRIEF DESCRIPTION OF THE DRAWINGS

FIG. 5 is a schematic diagram of a specific structure of another array substrate provided by an embodiment of the present disclosure;

FIG. 6 is a flow diagram of a driving method provided by an embodiment of the present disclosure;

DETAILED DESCRIPTION OF THE EMBODIMENTS

In order to make the purpose, technical solutions and advantages of the present disclosure clearer, the detailed descriptions of an array substrate, a driving method, an organic light emitting display panel and a display device provided by embodiments of the present disclosure are shown in detail below in combination with accompanying drawings. It should be understood that preferred embodiments described below are only configured to illustrate and explain the present disclosure, but are not configured to limit the present disclosure. In addition, embodiments in this application and characteristics in the embodiments can be combined with each other under the condition that no conflicts exist. It should be noted that the thickness and shape of each layer of film in the accompanying drawings do not reflect real scales of the array substrate, and are merely to illustrate the contents of the present disclosure. Furthermore, same or similar numerals throughout indicate same or similar elements or elements with same or similar functions.

Figure 1:
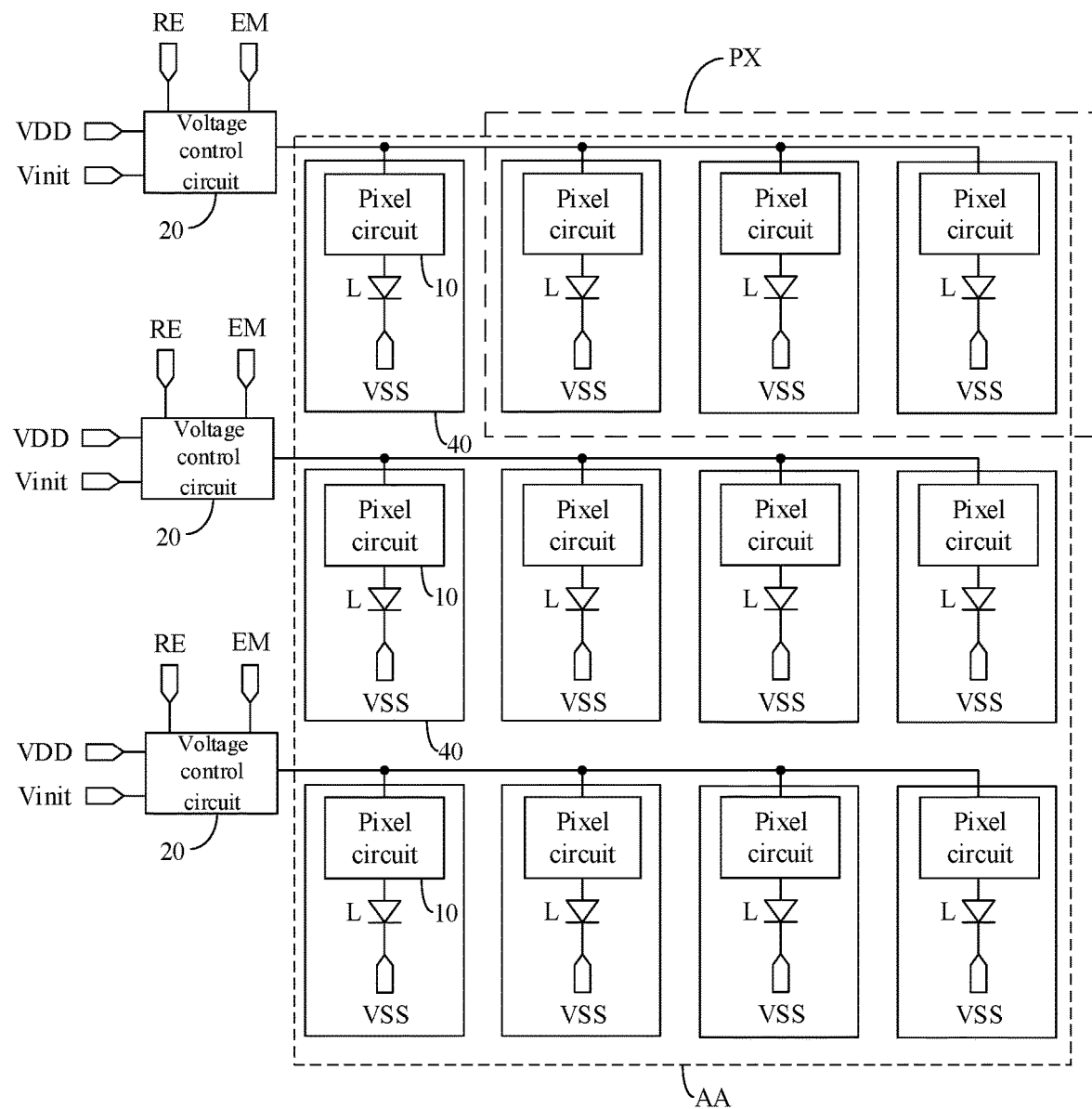
FIG. 1 is a schematic structural diagram of an array substrate provided by an embodiment of the present disclosure.

An embodiment of the present disclosure provides an array substrate, as shown in FIG. 1, the array substrate can include:

- a plurality of light emitting devices L, the plurality of light emitting devices L being located in a display area AA;
- pixel circuits 10, the pixel circuits 10 being located in the display area AA and being coupled with the light emitting devices L, optionally, one of the pixel circuits 10 being correspondingly coupled with one of the light emitting devices L, the pixel circuits 10 being in one-to-one correspondence to the light emitting devices L, and the pixel circuits 10 including driving transistors; and
- a plurality of voltage control circuits 20, the plurality of voltage control circuits 20 being located in a non-display area (an area except the display area AA in the array substrate); and at least two of the pixel circuits 10 sharing one of the voltage control circuits 20, and in one row of pixel circuits 10, first electrodes of the driving transistors being coupled with the shared voltage control circuit 20, and second electrodes of the driving transistors being coupled with the corresponding light emitting devices L. The voltage control circuits 20 are configured to output initialization signals Vinit to the first electrodes of the driving transistors in response to reset control signals RE so as to control the corresponding light emitting devices L to be reset, and output first power signals VDD to the first electrodes of the driving transistors in response to light emitting control signals EM so as to drive the light emitting devices L to emit light.

The above-mentioned array substrate provided by the embodiment of the present disclosure includes a plurality of light emitting devices and pixel circuits connected with the light emitting devices, both located in a display area as well as a plurality of voltage control circuits located in a non-display area, wherein at least two of the pixel circuits in one row share one of the voltage control circuits, so that the structure of each pixel circuit in the display area can be simplified, the area occupied by the pixel circuits in the display area can be reduced, and furthermore, more pixel circuits and light emitting devices can be arranged in the display area to obtain the organic light emitting display panel with the high PPI. Moreover, due to the control of the voltage control circuits over the reset control signals, the initialization signals are output to the first electrodes of the driving transistors to control the corresponding light emitting devices to be reset, so that influences of voltages loaded on the light emitting devices during previous-frame light emission on next-frame light emission can be avoided, and furthermore, the phenomenon of residual shadows is relieved.

During specific implementation, in the embodiment of the present disclosure, as shown in FIG. 1, the array substrate can further include: a plurality of pixel units PX located in the display area AA, and each of the pixel units PX includes a plurality of sub-pixels 40; and each of the sub-pixels 40 includes one of the light emitting devices L and one of the pixel circuits 10. Further, the pixel units PX can include three sub-pixels 40 with different colors. The three sub-pixels 40 can be respectively a red sub-pixel, a green sub-pixel and a blue sub-pixel. Of course, the pixel units can also include four, five or more sub-pixels, which is designed and determined according to an actual application environment, the limitations thereof are omitted herein.

During specific implementation, in the embodiment of the present disclosure, the pixel circuits are arranged in a plurality of rows, and the pixel circuits in at least two of the adjacent sub-pixels in the same row can share one of the voltage control circuits. In one row of pixel circuits 10, the first electrodes of the driving transistors are coupled with the shared voltage control circuit 20. Optionally, as shown in FIG. 1, all the pixel circuits 10 in the same row can share one of the voltage control circuits 20. Or the pixel circuits in two, three or more adjacent sub-pixels in the same row can share one of the voltage control circuits, the limitations thereof are omitted herein. In this way, the area occupied by the pixel circuits in the display area can be reduced through the shared voltage control circuits.

Figure 2:
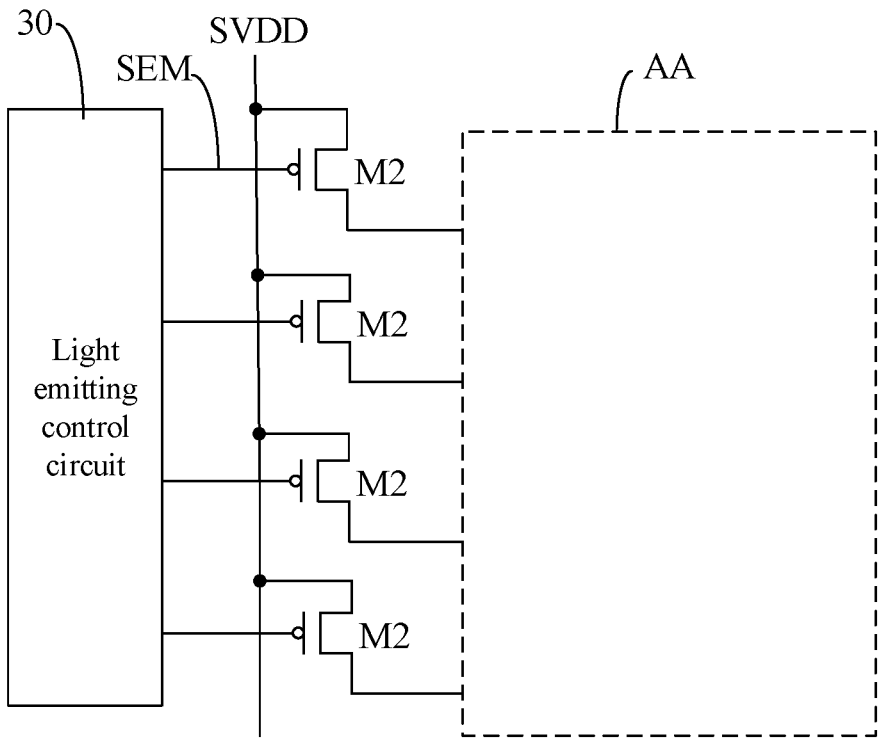
FIG. 2 is a schematic structural diagram of another array substrate provided by an embodiment of the present disclosure.

During specific implementation, in the embodiment of the present disclosure, as shown in FIG. 2, the array substrate can further include a plurality of light emitting control signal lines SEM and a light emitting control circuit 30 electrically connected with the light emitting control signal lines SEM, wherein one of the light emitting control signal lines SEM is electrically connected with the voltage control circuit electrically connected with one row of pixel circuits and is configured to input light emitting control signals to the electrically connected voltage control circuit. Optionally, one of the light emitting control signal lines SEM is electrically connected with gates of second switching transistors M2 electrically connected with one row of pixel circuits in the display area AA.

Figure 3A:
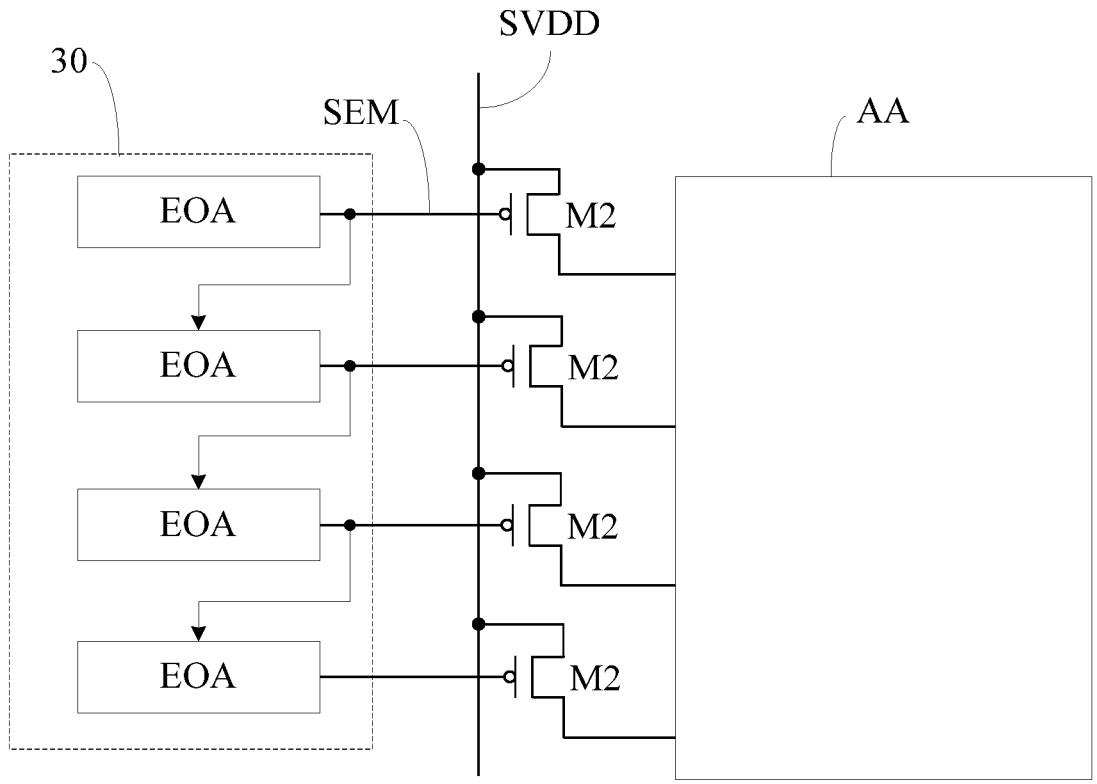
FIG. 3a is a schematic structural diagram of further array substrate provided by an embodiment of the present disclosure.
Figure 3B:
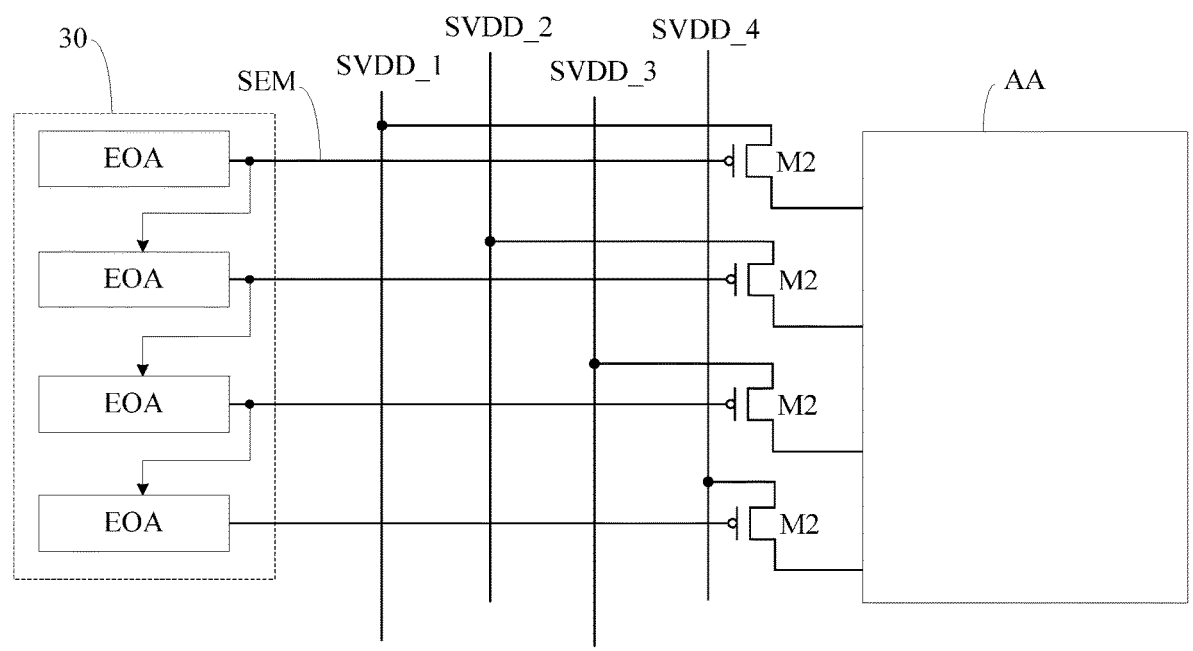
FIG. 3b is a schematic structural diagram of yet further array substrate provided by an embodiment of the present disclosure.

During specific implementation, in the embodiment of the present disclosure, as shown in FIG. 3a and FIG. 3b, the light emitting control circuit 30 can include a plurality of cascaded light emitting shift registers EOA, and each of the light emitting shift registers EOA is correspondingly and electrically connected with one of the light emitting control signal lines SEM. Optionally, a light emitting input signal end of the first stage of light emitting shift register EOA is configured to receive a frame light emitting triggering signal, and light emitting input signal ends of the remaining stages of light emitting shift registers EOA are respectively electrically connected with light emitting output signal ends of the adjacent previous stages of light emitting shift registers EOA, so that the function of inputting the light emitting control signals to the light emitting control signal lines SEM is obtained. In an actual application, structures of the light emitting shift registers are the same as existing structures, the descriptions thereof are omitted herein.

During specific implementation, in the embodiment of the present disclosure, as shown in FIG. 2 and FIG. 3a, the array substrate can further include: one first power signal line SVDD, wherein the first power signal line SVDD is electrically connected with all the voltage control circuits and is configured to input the first power signals to each of the voltage control circuits. Optionally, the first power signal line SVDD is electrically connected with first electrodes of all the second switching transistors M2. Moreover, the first power signal line SVDD can be arranged in the non-display area to further reduce the number of wires arranged in the display area AA, so that an organic light emitting display panel with a high PPI can be obtained.

During specific implementation, in the embodiment of the present disclosure, as shown in FIG. 3b, the array substrate can further include: a plurality of first power signal lines SVDD_m (1≤m≤M, m and M are both integers, and M represents for the total number of the first power signal lines, for example, M=4 in FIG. 3b), wherein one of the light emitting control signal lines SVDD_m is electrically connected with the voltage control circuit electrically connected with one row of pixel circuits and is configured to input the first power signals to the electrically connected voltage control circuit. Optionally, one of the light emitting control signal lines SVDD_m is electrically connected with the first electrodes of all the second switching transistors M2 in one row. Moreover, all the light emitting control signal lines SVDD_m can be arranged in the non-display area to further reduce the number of wires arranged in the display area AA, so that the organic light emitting display panel with the high PPI can be obtained.

Figure 4:
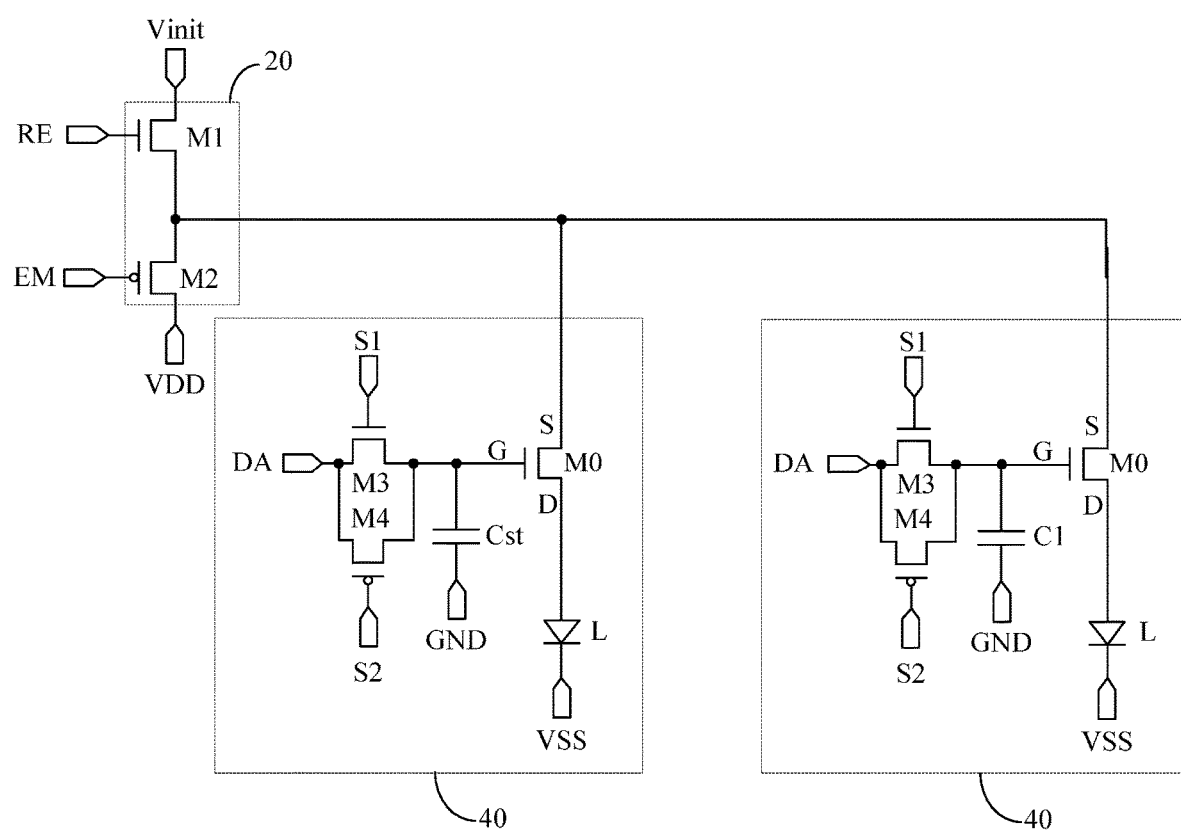
FIG. 4 is a schematic diagram of a specific structure of an array substrate provided by an embodiment of the present disclosure.

During specific implementation, in the embodiment of the present disclosure, as shown in FIG. 4 and FIG. 5, driving transistors M0 can be N-type transistors, and when currents flow from first ends S to second ends D, the first ends S can be used as sources of the driving transistors M0, and the second ends D can be used as drains of the driving transistors M0. When the currents flow from the second ends D to the first ends S, the second ends D can be used as the sources of the driving transistors M0, and the first ends S can be used as the drains of the driving transistors M0. Moreover, the light emitting devices L can include OLEDs. In this way, anodes of the OLEDs are electrically connected with the second ends D of the driving transistors M0, and cathodes of the OLEDs are electrically connected with the second power ends VSS. Voltages of the second power ends VSS are generally negative voltages or grounding voltages $V_{GND}$ (generally 0V), and voltages of the initialization signals can also be set as the grounding voltages $V_{GND}$, the limitations thereof are omitted herein. The OLEDs can be set as Micro-OLEDs or Mini-OLEDs, which is further beneficial to the obtaining of the organic light emitting display panel with the high PPI.

During specific implementation, the voltage control circuits can include: first switching transistors; and gates of the first switching transistors are configured to receive reset control signals, first electrodes of the first switching transistors are configured to receive initialization signals, and second electrodes of the first switching transistors are coupled with the first electrodes of the corresponding driving transistors. Optionally, the voltage control circuits can further include: second switching transistors; and gates of the second switching transistors are configured to receive light emitting control signals, first electrodes of the second switching transistors are configured to receive first power signals, and second electrodes of the second switching transistors are coupled with the first electrodes of the corresponding driving transistors. The description that the voltage control circuits include the first switching transistors and the second switching transistors are specifically as follows: as shown in FIG. 4 and FIG. 5 (with two pixel circuits included in one row as an example), the voltage control circuits 20 can include: first switching transistors M1 and second switching transistors M2, wherein gates of the first switching transistors M1 are configured to receive reset control signals RE, first electrodes of the first switching transistors M1 are configured to receive initialization signals Vinit, and second electrodes of the first switching transistors M1 are coupled with first electrodes S of the corresponding driving transistors M0. Gates of the second switching transistors M2 are configured to receive light emitting control signals EM, first electrodes of the second switching transistors M2 are configured to receive first power signals VDD, and second electrodes of the second switching transistors M2 are coupled with the first electrodes S of the corresponding driving transistors M0.

During specific implementation, as shown in FIG. 4 and FIG. 5, types of the first switching transistors M1 can be different from types of the second switching transistors M2. For example, the first switching transistors M1 are N-type transistors, and the second switching transistors M2 are P-type transistors. Or the first switching transistors M1 are P-type transistors, and the second switching transistors M2 are N-type transistors. Of course, the types of the first switching transistors M1 can also be the same as the types of the second switching transistors M2. In the actual application, the types of the first switching transistors M1 and the second switching transistors M2 are designed according to the actual application environment, the limitations thereof are omitted herein.

During specific implementation, in the embodiment of the present disclosure, as shown in FIG. 4 and FIG. 5, the pixel circuits 10 can further include: third switching transistors M3 and storage capacitors Cst, wherein gates of the third switching transistors M3 are configured to receive first gate scanning signals S1 and are coupled with first gate driving circuits, first electrodes of the third switching transistors M3 are configured to receive data signals DA, and second electrodes of the third switching transistors M3 are coupled with gates G of the driving transistors M0. First ends of the storage capacitors Cst are coupled with the gates G of the driving transistors M0, and second ends of the storage capacitors Cst are coupled with grounding ends GND.

Further, during specific implementation, in the embodiment of the present disclosure, as shown in FIG. 4 and FIG. 5, the pixel circuits 10 can further include: fourth switching transistors M4, wherein gates of the fourth switching transistors M4 are configured to receive second gate scanning signals S2 and are coupled with second gate driving circuits, first electrodes of the fourth switching transistors M4 are configured to receive data signals DA, and second electrodes of the fourth switching transistors M4 are coupled with the gates G of the driving transistors M0. Moreover, types of the fourth switching transistors M4 are different from the types of the third switching transistors M3. For example, the third switching transistors M3 are N-type transistors, and the fourth switching transistors M4 are P-type transistors; or the third switching transistors M3 are P-type transistors, and the fourth switching transistors M4 are N-type transistors.

During specific implementation, in the embodiment of the present disclosure, as shown in FIG. 5, the pixel circuits 10 can further include: fifth switching transistors M5, wherein the second electrodes D of the driving transistors M0 are coupled with the corresponding light emitting devices L through the fifth switching transistors M5. Moreover, gates of the fifth switching transistors M5 are coupled with reference signal ends, first electrodes of the fifth switching transistors M5 are coupled with the second electrodes D of the driving transistors M0, and second electrodes of the fifth switching transistors M5 are coupled with the corresponding light emitting devices L. Further, the fifth switching transistors M5 can be set as P-type transistors, and the reference signal ends can be set as grounding ends GND.

Further, during specific implementation, the P-type transistors are cut off under the actions of high-level signals and are turned on under the actions of low-level signals; and the N-type transistors are turned on under the actions of high-level signals and are cut off under the actions of low-level signals.

It should be explained that the above-mentioned switching transistors can be TFTs (Thin Film Transistors) or MOS (Metal Oxide Semiconductor) field-effect transistors, the limitations thereof are omitted herein. During specific implementation, the first electrodes of the above-mentioned switching transistors can be used as sources thereof, and the second electrodes of the switching transistors can be used as drains thereof; or the second electrodes of the switching transistors can be used as the sources thereof, and the first electrodes of the switching transistors can be used as the drains thereof, the limitations thereof are omitted herein.

Based on the same inventive concept, an embodiment of the present disclosure further provides a driving method for the array substrate provided by the embodiment of the present disclosure, and the driving method can include: controlling voltage control circuits and pixel circuits within one-frame display time so as to drive light emitting devices to work.

During specific implementation, as shown in FIG. 6, the step of driving one row of light emitting devices work can include the following steps:

S601, in a reset stage, outputting by the voltage control circuits, initialization signals to first electrodes of driving transistors in response to reset control signals so as to control the corresponding light emitting devices to be reset;

S602, in a data writing stage, outing data signals are to gates of the driving transistors; and S603, in a light emitting stage, outputting by the voltage control circuits, first power signals to the first electrodes of the driving transistors in response to light emitting control signals so as to drive the light emitting devices to emit light.

The driving method for the above-mentioned array substrate provided by the embodiment of the present disclosure is described below by taking the step of driving one row of light emitting devices to work and the structure of the array substrate as shown in FIG. 4 and FIG. 5 as examples in combination with a circuit sequence diagram. In the following description, 1 represents for a high-level signal, 0 represents for a low-level signal, and it should be noted that 1 and 0 are logic levels and are merely intended to better explain a specific working process of the embodiment of the present disclosure, rather than to represent for a level applied to the gate of each switching transistor during specific implementation.

First Embodiment

Figure 7:
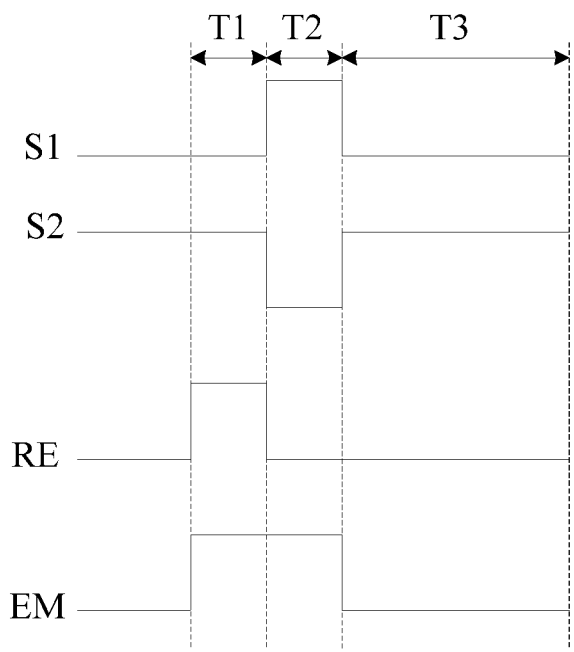
FIG. 7 is one circuit sequence diagram provided by an embodiment of the present disclosure.

With the array substrate shown as FIG. 4, M1 being an N-type transistor, M2 being a P-type transistor, M3 being an N-type transistor and M4 being a P-type transistor as an example, a corresponding circuit sequence diagram is shown as FIG. 7. The step of driving one row of light emitting devices to work can include: a reset stage T1, a data writing stage T2 and a light emitting stage T3.

At the reset stage T1, S1=0, S2=1, RE=1, and EM=1.

Since EM=1, second switching transistors M2 are cut off. Since S1=0, third switching transistors M3 are cut off. Since S2=1, fourth switching transistors M4 are cut off. Since RE=1, first switching transistors M1 are turned on so as to provide initialization signals Vinit to first electrodes S of driving transistors M0. It should be noted that if gates G of the driving transistors M0 store high-gray-level data signals (namely high gray levels are displayed) through storage capacitors Cst during previous-frame display, voltages of the first electrodes S, second electrodes D of the driving transistors M0 and anodes of light emitting devices L can be reset to grounding voltages $V_{GND}$. If the gates G of the driving transistors M0 store low-gray-level data signals (namely low gray levels are displayed) through the storage capacitors Cst during previous-frame display, voltages of the first electrodes S of the driving transistors M0 are reset to the grounding voltages $V_{GND}$, and currents flow from the second electrodes D of the driving transistors M0 to the first electrodes S of the driving transistors M0, so that the voltages of the second electrodes D and the anodes of the light emitting devices L can be reset as $V_{GND}$-$V_{th}$. $V_{th}$ represents for threshold voltages of the driving transistors M0. In this way, influences of voltages loaded on the light emitting devices during previous-frame light emission on next-frame light emission can be avoided, and furthermore, the phenomenon of residual shadows is relieved.

At the data writing stage T2, S1=1, S2=0, RE=0, and EM=1.

Since EM=1, the second switching transistors M2 are cut off. Since RE=0, the first switching transistors M1 are cut off. Since S1=1, the third switching transistors M3 are turned on. Since S2=0, the fourth switching transistors M4 are turned on. The turned-on third switching transistors M3 and the turned-on fourth switching transistors M4 can provide data signals DA to the gates G of the driving transistors M0, so that the gates G of the driving transistors M0 are voltages $V_{DA}$ of the data signals and are stored through the storage capacitors Cst. It should be noted that the P-type fourth switching transistors M4 are turned on so as to transmit the data signals DA to the gates G of the driving transistors M0 when the voltages of the data signals DA are voltages corresponding to high gray levels, so that the voltages of the data signals DA can be prevented from being affected by threshold voltages $V_{th}$ (M3) of the N-type third switching transistors M3. The N-type third switching transistors M3 are turned on so as to transmit the data signals DA to the gates G of the driving transistors M0 when the voltages of the data signals DA are voltages corresponding to low gray levels, so that the voltages of the data signals DA can be prevented from being affected by threshold voltages $V_{th}$ (M4) of the P-type fourth switching transistors M4. In this way, the range of the voltages input to the gates G of the driving transistors M0 can be widened.

At the light emitting stage T3, S1=0, S2=1, RE=0, and EM=1.

Since RE=0, the first switching transistors M1 are cut off. Since S1=0, the third switching transistors M3 are cut off. Since S2=1, the fourth switching transistors M4 are cut off. Since EM=1, the second switching transistors M2 are turned on to provide first power signals VDD to the first electrodes S of the driving transistors M0, so that voltages of the first electrodes S of the driving transistors M0 are voltages $V_{dd}$ of the first power signals VDD. Known according to characteristics of the currents, working currents I flowing through the driving transistors M0 and being configured to drive the light emitting devices L to emit light meet a formula: $I=K(V_{GD}-V_{th})^2=K(V_{DA}-V_D-V_{th})^2$, wherein $V_D$ represents for voltages of the second electrodes D of the driving transistors M0, K is a structural parameter, and the numerical values are relatively stable in the same structure and can be regarded as constants. In this way, the working currents I flow from the first power signals VDD to the light emitting devices L through the second switching transistors M2 and the driving transistors M0 so as to drive the light emitting devices L to emit light. It should be noted that the voltages $V_D$ of the second electrodes D of the driving transistors M0 can be approximate to $V_{DA}-V_{th}$, however, in fact, $V_D<V_{DA}-V_{th}$. In this way, the voltages $V_D$ can be changed by controlling the voltages of the gates G of the driving transistors M0, so that voltage differences between the two electrodes of the light emitting devices L are changed, and furthermore, the light emission of the light emitting devices is changed.

Second Embodiment

The structure of the array substrate corresponding to the present embodiment is shown as FIG. 4 and is modified with specific to the implementation way in the first embodiment. Differences between the present embodiment and the first embodiment are merely described below, and the descriptions for similarities thereof are omitted herein. During specific implementation, as shown in FIG. 8, after the light emitting stage T3, the step of driving one row of light emitting devices to work can further include: a non-light-emitting stage T4, wherein in the non-light-emitting stage T4, the voltage control circuits disconnect the first power signals from the first electrodes of the driving transistors in response to light emitting control signals EM so as to control the corresponding pixel circuits to drive the connected light emitting devices to stop emitting light.

Figure 8:
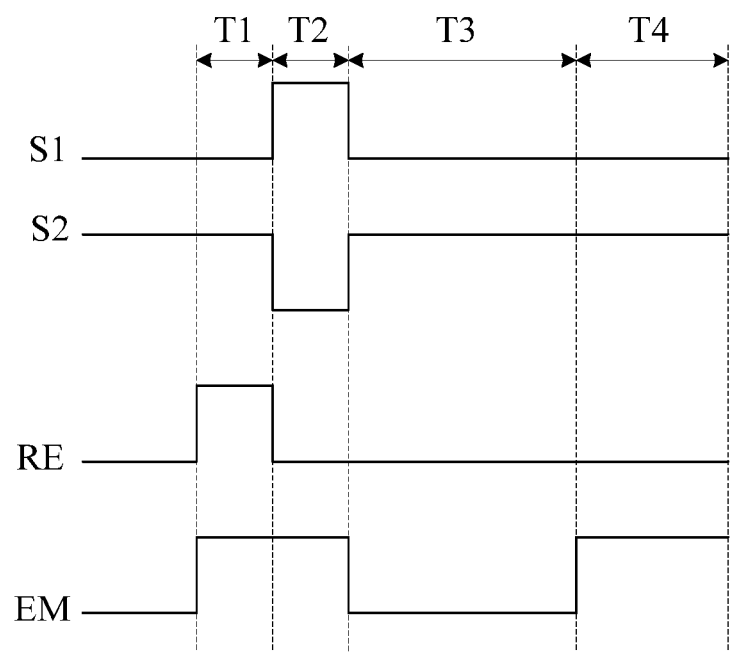
FIG. 8 is another circuit sequence diagram provided by an embodiment of the present disclosure.

Optionally, the corresponding circuit sequence diagram is shown as FIG. 8. The step of driving one row of light emitting devices to work can include: a reset stage T1, a data writing stage T2, a light emitting stage T3 and the non-light-emitting stage T4, wherein the reset stage T1, the data writing stage T2 and the light emitting stage T3 can refer to the first embodiment, the descriptions thereof are omitted herein.

At the non-light-emitting stage T4, S1=0, S2=1, RE=0, and EM=1. Since RE=0, the first switching transistors M1 are cut off. Since S1=0, the third switching transistors M3 are cut off. Since S2=1, the fourth switching transistors M4 are cut off. Since EM=1, the second switching transistors M2 are cut off. In this way, the first power signals VDD do not flow to the light emitting devices L through the second switching transistors M2 and the driving transistors M0, so that the light emitting devices L can be driven to stop emitting light. In this way, influences of voltages loaded on the anodes of the light emitting devices L during previous-frame light emission on next-frame light emission can be further avoided, and furthermore, the phenomenon of residual shadows is relieved.

Third Embodiment

Figure 9:
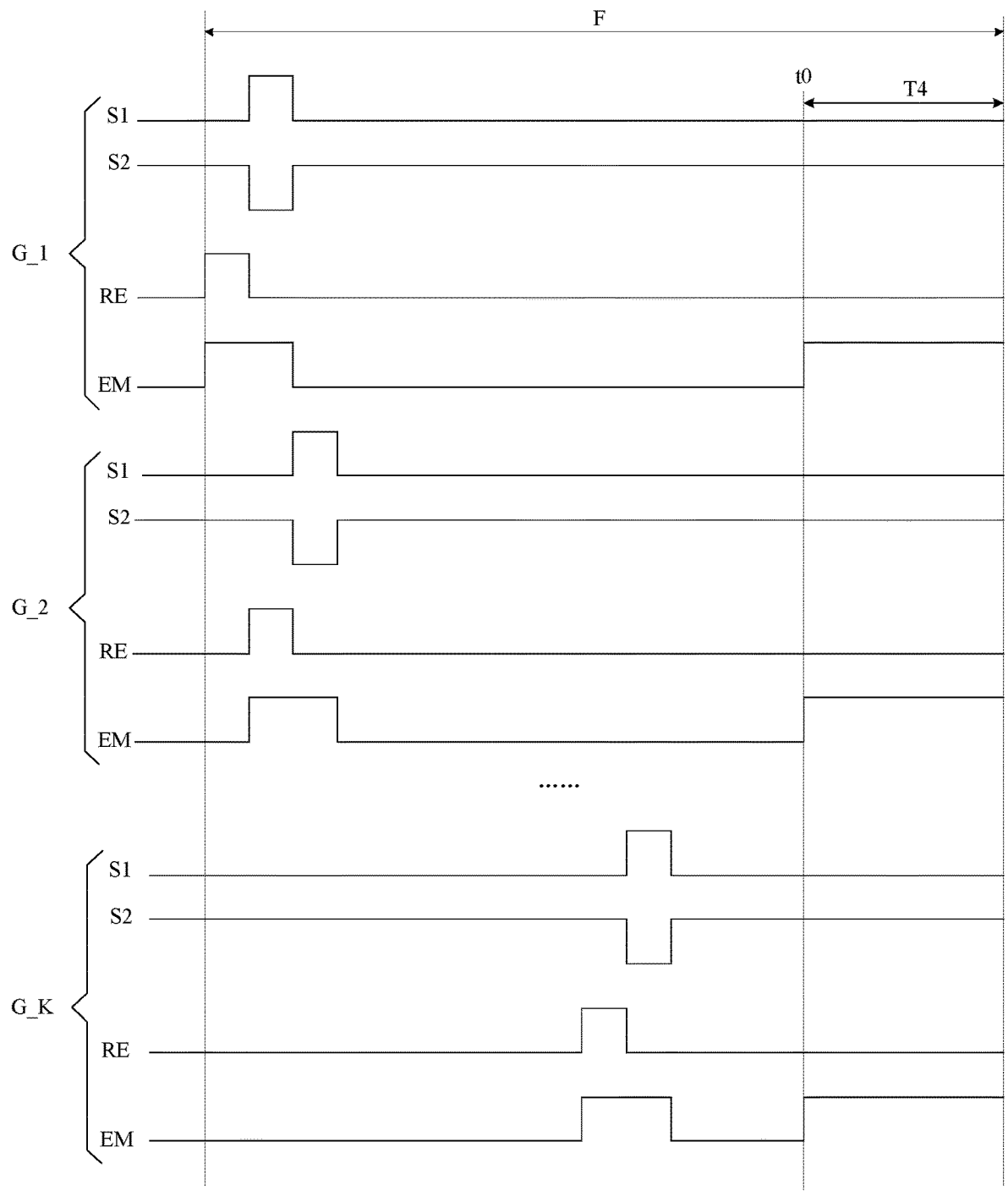
FIG. 9 is another circuit sequence diagram provided by an embodiment of the present disclosure.

During specific implementation, as shown in FIG. 9, the non-light-emitting stage T4 of driving each row of light emitting devices to work can be started at the same time t0 within the one-frame display time F (namely, Frame).

Optionally, a general array substrate can include K rows of pixel units, wherein K is a positive integer. G_k ($1 \le k \le K$, and k is an integer) represents for each signal for driving the pixel circuits in the kth row of pixel units to work. The pixel circuits can be driven to work in a row-by-row driving way within one-frame display time Frame, and the light emitting devices in each row of pixel units are controlled to simultaneously stop emitting light after the light emitting devices in the first row to the last row of pixel units are driven to emit light. For example, when the one-frame display time Frame is 11.1 ms, the non-light-emitting stage T4 can occupy 2 ms, the remaining 9.1 ms serves as the duration for driving the pixel circuits in the first row to the last row of pixel units to emit light.

Fourth Embodiment

Figure 10:
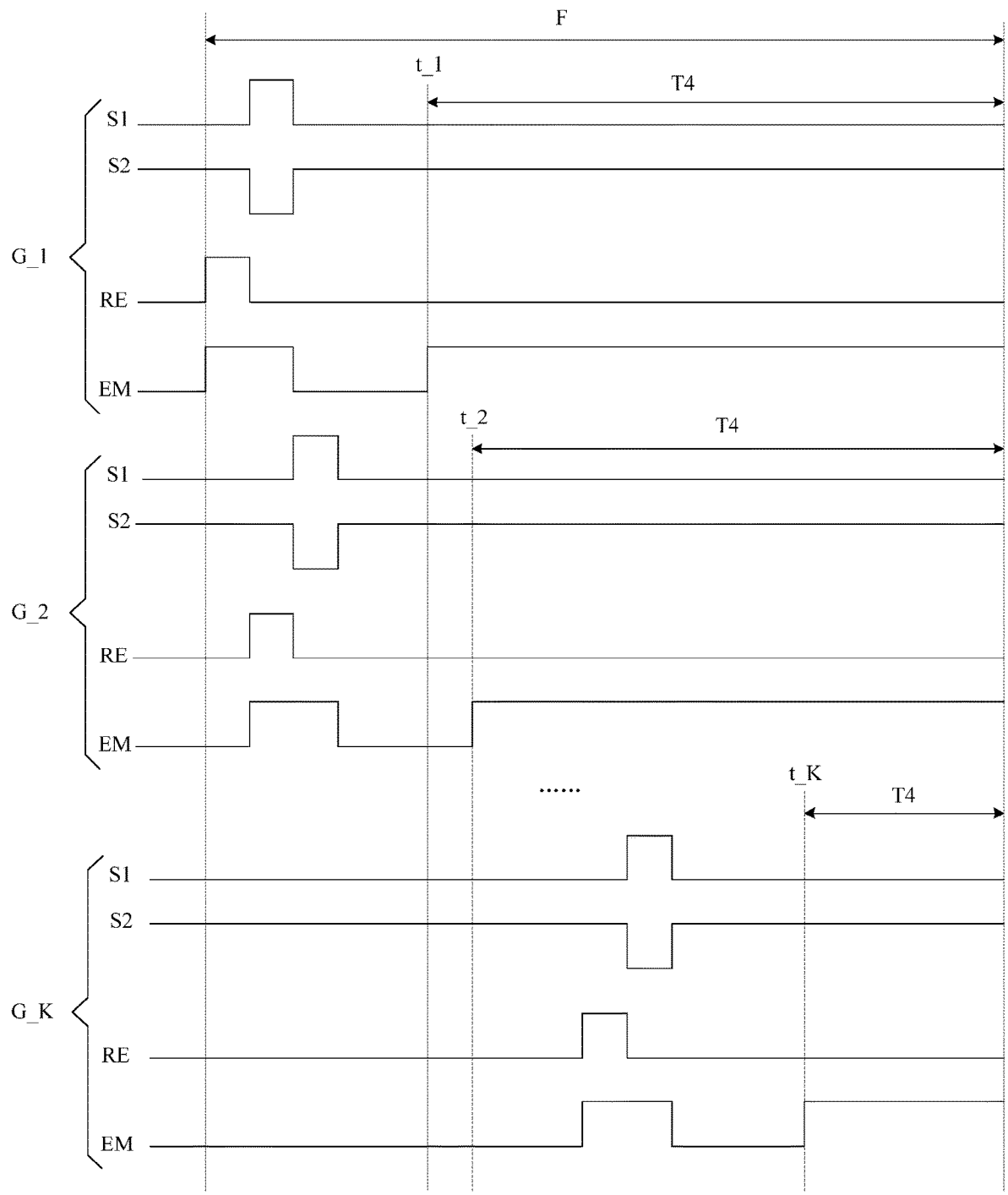
FIG. 10 is further circuit sequence diagram provided by an embodiment of the present disclosure.

During specific implementation, as shown in FIG. 10, the non-light-emitting stage T4 of driving each row of light emitting devices to work is sequentially started row by row within the one-frame display time Frame. The pixel circuits in the first row to the last row of pixel units can be driven to sequentially work in a row-by-row driving way within the one-frame display time Frame.

Optionally, after the light emitting devices in the first row of pixel units are driven to emit light, the non-light-emitting stage T4 is started at time t_1, and the second switching transistors electrically connected with the first row of pixel circuits are controlled to be cut off so as to control the light emitting devices in the first row of pixel units to stop emitting light. After the light emitting devices in the second row of pixel units are driven to emit light, the non-light-emitting stage T4 is started at time t_2, and the second switching transistors electrically connected with the second row of pixel circuits are controlled to be cut off so as to control the light emitting devices in the second row of pixel units to stop emitting light. After the light emitting devices in the Kth row of pixel units are driven to emit light, the non-light-emitting stage T4 is started at time t K, and the second switching transistors electrically connected with the Kth row of pixel circuits are controlled to be cut off so as to control the light emitting devices in the Kth row of pixel units to stop emitting light. The rest is reasoned by analogy, the descriptions thereof are omitted herein.

Fifth Embodiment

The structure of the array substrate corresponding to the present embodiment is shown as FIG. 4 and is modified with specific to the implementation way in the first embodiment. Differences between the present embodiment and the first embodiment are merely described below, and the descriptions for similarities thereof are omitted herein.

Figure 11:
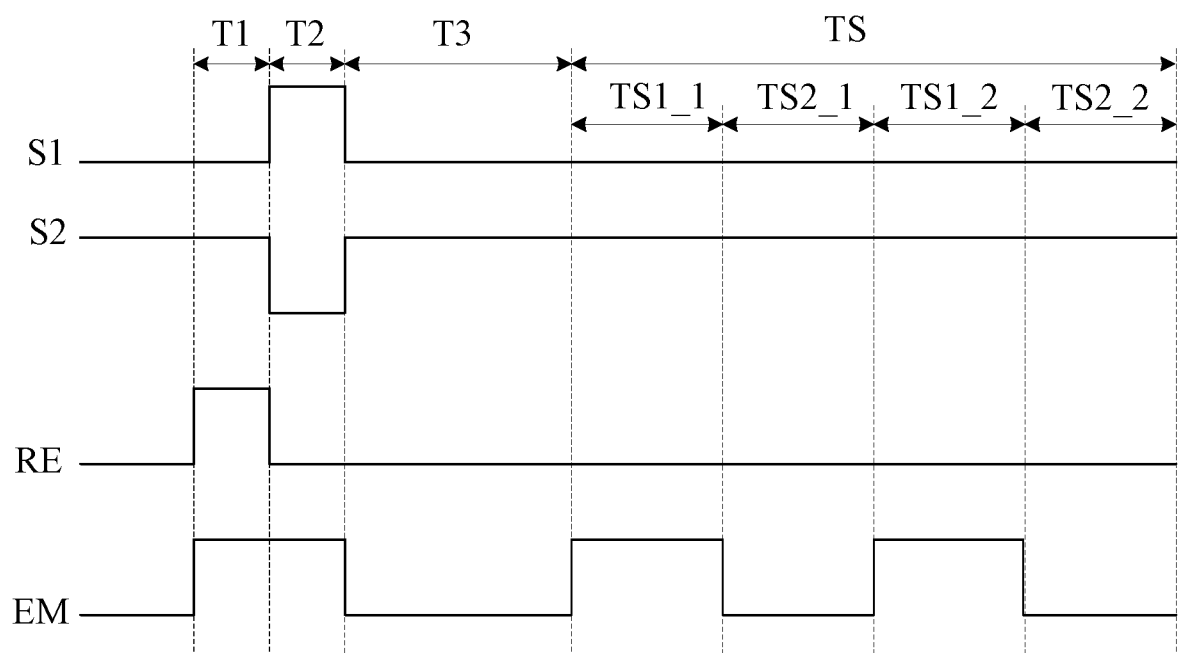
FIG. 11 is yet further circuit sequence diagram provided by an embodiment of the present disclosure.

During specific implementation, as shown in FIG. 11, after the light emitting stage T3, the step of driving one row of light emitting devices to work can further include: a dimming stage TS. The dimming stage TS can include: at least one non-light-emitting stage TS1_x($1 \le x \le X$, x and X are positive integers, X represents for the total number of non-light-emitting stages at the dimming stage, and an example in which X=2 is shown in FIG. 11) and at least one light emitting stage TS2_y ($1 \le y \le Y$, y and Y are positive integers, Y represents for the total number of light emitting stages at the dimming stage, and an example in which Y=2 is shown in FIG. 11), wherein the non-light-emitting stage TS1_x and the light emitting stage TS2_y are sequentially and alternately arranged. X can be set as 1, 2, 3 and so on, Y can be set as 1, 2, 3 and so on, of course, in the actual application, the demands for the brightness of the light emitting devices in different application environments are different, and therefore, the specific implementation of the number of the non-light-emitting stages and the light emitting stages at the dimming stage can be designed and determined according to the actual application environment, the limitations thereof are omitted herein.

Optionally, at the non-light-emitting stage TS1_x, the voltage control circuits disconnect the first power signals from the first electrodes of the driving transistors in response to the light emitting control signals so as to control the corresponding pixel circuits to drive the connected light emitting devices to stop emitting light; and at the light emitting stage TS2_y, the voltage control circuits output the first power signals to the first electrodes of the driving transistors in response to the light emitting control signals so as to control the corresponding pixel circuits to drive the connected light emitting devices to emit light. In this way, due to the setting of the dimming stage, the brightness of the light emitting devices can be effectively controlled.

Optionally, as shown in FIG. 11, the dimming stage TS can include: a non-light-emitting stage TS1_1, a light emitting stage TS2_1, a non-light-emitting stage TS1_2 and a light emitting stage TS2_2 which are arranged in sequence. Or the dimming stage can also include a non-light-emitting stage, a light emitting stage and a non-light-emitting stage which are arranged in sequence, the limitations thereof are omitted herein.

The working process of the dimming stage TS is described below by taking FIG. 4 as an example in combination with the circuit sequence diagram as shown in FIG. 11. At the non-light-emitting stage TS1_1, S1=0, S2=1, RE=0, and EM=1. Since RE=0, the first switching transistors M1 are cut off. Since S1=0, the third switching transistors M3 are cut off. Since S2=1, the fourth switching transistors M4 are cut off. Since EM=1, the second switching transistors M2 are cut off. In this way, the first power signals do not flow to the light emitting devices L through the second switching transistors M2 and the driving transistors M0, so that the light emitting devices L are driven to stop emitting light.

At the light emitting stage TS2_1, S1=0, S2=1, RE=0, and EM=0. Since RE=0, the first switching transistors M1 are cut off. Since S1=0, the third switching transistors M3 are cut off. Since S2=1, the fourth switching transistors M4 are cut off. Since EM=0, the second switching transistors M2 are turned on to provide the first power signals VDD to the first electrodes S of the driving transistors M0, and thus, working currents I flow from the first power signals VDD to the light emitting devices L through the second switching transistors M2 and the driving transistors M0 so as to drive the light emitting devices L to emit light.

At the non-light-emitting stage TS1_2, S1=0, S2=1, RE=0, and EM=1. Since RE=0, the first switching transistors M1 are cut off. Since S1=0, the third switching transistors M3 are cut off. Since S2=1, the fourth switching transistors M4 are cut off. Since EM=1, the second switching transistors M2 are cut off. In this way, the first power signals do not flow to the light emitting devices L through the second switching transistors M2 and the driving transistors M0, so that the light emitting devices L are driven to stop emitting light.

At the light emitting stage TS2_2, S1=0, S2=1, RE=0, EM=0. Since RE=0, the first switching transistors M1 are cut off. Since S1=0, the third switching transistors M3 are cut off. Since S2=1, the fourth switching transistors M4 are cut off. Since EM=0, the second switching transistors M2 are turned on to provide the first power signals VDD to the first electrodes S of the driving transistors M0, and thus, the working currents I flow from the first power signals VDD to the light emitting devices L through the second switching transistors M2 and the driving transistors M0 so as to drive the light emitting devices L to emit light.

Sixth Embodiment

Figure 12:
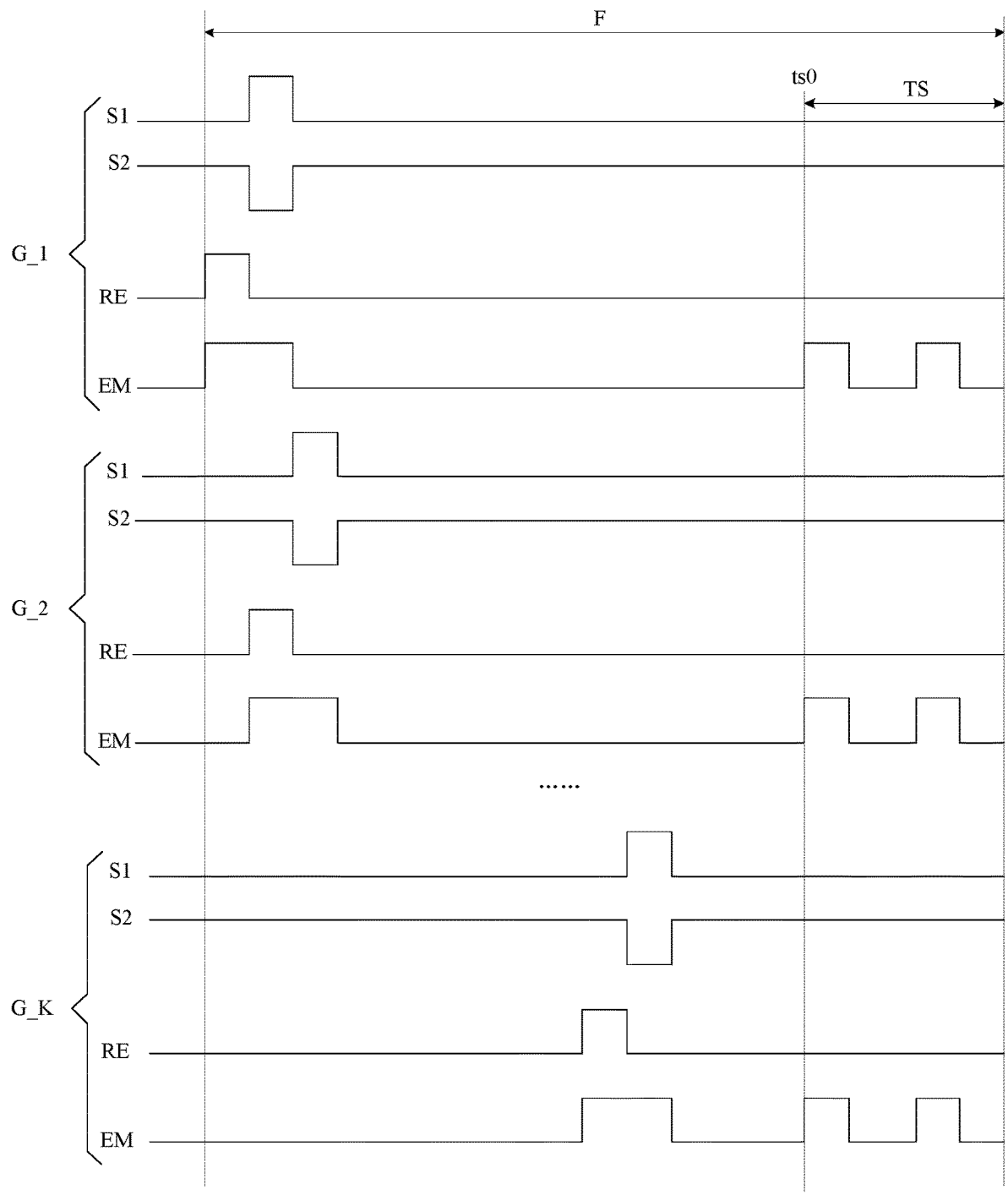
FIG. 12 is further another circuit sequence diagram provided by an embodiment of the present disclosure.

During specific implementation, as shown in FIG. 12, the dimming stage TS of driving each row of light emitting devices to work is started at the same time ts0 within one-frame display time Frame.

Optionally, the pixel circuits can be driven to work in a row-by-row driving way within the one-frame display time Frame, and the light emitting devices in each row of pixel units are controlled to simultaneously enter the dimming stage TS at the time ts0 after the light emitting devices in the first row to the last row of pixel units are driven to emit light.

Seventh Embodiment

Figure 13:
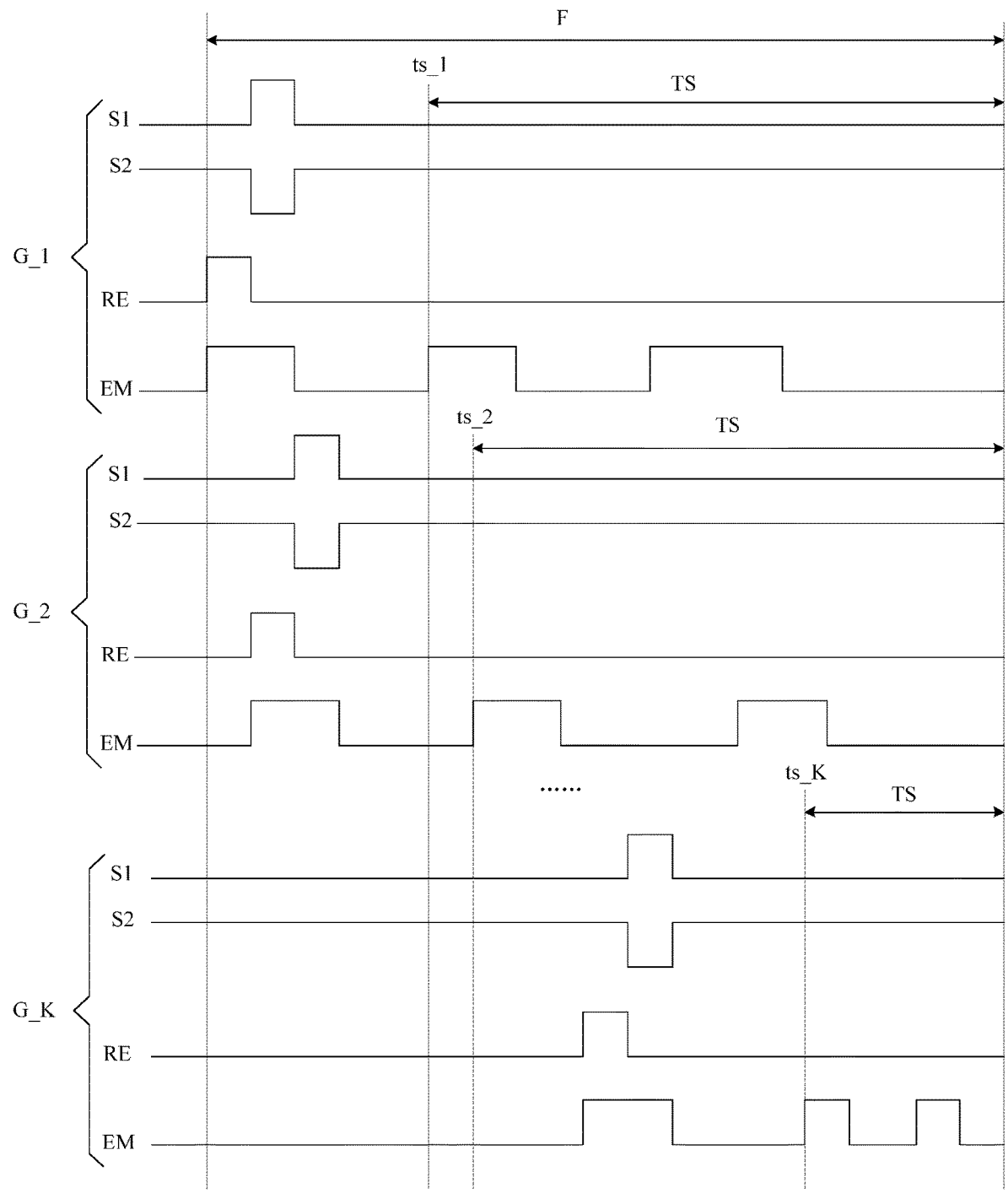
FIG. 13 is yet further another circuit sequence diagram provided by an embodiment of the present disclosure.

During specific implementation, as shown in FIG. 13, the dimming stage TS of driving each row of light emitting devices to work is sequentially started row by row within the one-frame display time Frame.

Optionally, the pixel circuits in the first row to the last row of pixel units can be driven to sequentially work in a row-by-row driving way within the one-frame display time Frame. Specifically, after the light emitting devices in the first row of pixel units are driven to emit light, the dimming stage TS is started at time ts_1. After the light emitting devices in the second row of pixel units are driven to emit light, the dimming stage TS is started at time ts_2. After the light emitting devices in the Kth row of pixel units are driven to emit light, the dimming stage TS is started at time t K. The rest is reasoned by analogy, the descriptions thereof are omitted herein.

Eighth Embodiment

Further, compared with the structure of the array substrate as shown in FIG. 4, the structure of the array substrate as shown in FIG. 5 lies in that P-type fifth switching transistors M5 are arranged between the second electrodes D of the driving transistors M0 and the anodes of the light emitting devices L. The fifth switching transistors M5 can function as contrast clampers. Optionally, when the voltages of the data signals DA are voltages (such as high voltages) corresponding to high gray levels, namely a high-gray-level picture is displayed, gates of the fifth switching transistors M5 are connected with grounding ends GND, so that the fifth switching transistors M5 can be in a turned-on state under the control of the voltages of the grounding ends GND and the voltages of the second electrodes D of the driving transistors M0, and furthermore, $V_{DA}-V_{th}$ are applied to the anodes of the light emitting devices L, in this way, the maximum brightness of the light emitting devices L cannot be affected. When the voltages of the data signals DA are voltages (such as low voltages) corresponding to low gray levels, namely a low-gray-level picture is displayed, the gates of the fifth switching transistors M5 are connected with the grounding ends GND, so that the fifth switching transistors M5 cannot be turned on under the control of the voltages of the grounding ends GND and the voltages of the second electrodes D of the driving transistors M0, and furthermore, very low currents flow through the fifth switching transistors M5, which is equivalent to the disconnection between the second electrodes D of the driving transistors M0 and the light emitting devices L, in this way, the brightness of the light emitting devices L can reach much lower levels. Thus, it can be known that the contrasts of the light emitting devices L under such a mode are lowest according to a contrast formula.

Moreover, the working process of the structure of the array substrate as shown in FIG. 5 at other stages can respectively refer to the first embodiment to the seventh embodiment, the descriptions thereof are omitted herein.

Based on the same disclosure concept, an embodiment of the present disclosure further provides an organic light emitting display panel including the array substrate provided by the embodiment of the present disclosure. The problem solving principle of the organic light emitting display panel is similar to that of the above-mentioned array substrate, and therefore, the implementation of the organic light emitting display panel can refer to that of the above-mentioned array substrate, the descriptions thereof are omitted herein.

Based on the same disclosure concept, an embodiment of the present disclosure further provides a display device including the above-mentioned organic light emitting display panel provided by the embodiment of the present disclosure. The display device can include any product or component with a display function, such as a mobile phone, a tablet personal computer, a television, a display, a notebook computer, a digital photo frame and a navigator. Other essential components of the display device should be understood to be provided by the ordinary skilled in the art, the descriptions thereof are omitted herein, and the components should not be regarded as limitations to the present disclosure. The implementation of the display device can refer to the embodiment of the above-mentioned organic light emitting display panel, the descriptions thereof are omitted herein.

According to the array substrate, the driving method, the organic light emitting display panel and the display device provided by the embodiments of the present disclosure, the array substrate includes a plurality of light emitting devices and pixel circuits connected with the light emitting devices located in a display area as well as a plurality of voltage control circuits located in a non-display area, wherein at least two of the pixel circuits in one row share one of the voltage control circuits, so that the structure of each pixel circuit in the display area can be simplified, the area occupied by the pixel circuits in the display area can be reduced, and furthermore, more pixel circuits and light emitting devices can be arranged in the display area to obtain the organic light emitting display panel with the high PPI. Moreover, due to the control of the voltage control circuits over the reset control signals, the initialization signals are output to the first electrodes of the driving transistors to control the corresponding light emitting devices to be reset, so that influences of voltages loaded on the light emitting devices during previous-frame light emission on next-frame light emission can be avoided, and furthermore, the phenomenon of residual shadows is relieved.

Obviously, various alternations and modifications of the present disclosure can be made by the skilled in the art without departing from the spirit and scope of the present disclosure. Thus, if the alterations and modifications of the present disclosure fall into the claims of the present disclosure and the equivalent technologies thereof, the present disclosure is also intended to include the alterations and modifications.

The invention claimed is:

1. An array substrate, comprising:
a plurality of light emitting devices being located in a display area;
pixel circuits being located in the display area and being coupled with the light emitting devices, and the pixel circuits comprising driving transistors;
a plurality of voltage control circuits being located in a non-display area; and at least two of the pixel circuits sharing one of the voltage control circuits, and in one row of pixel circuits, first electrodes of the driving transistors being coupled with shared voltage control circuit, and second electrodes of the driving transistors being coupled with corresponding light emitting devices; and
a plurality of pixel units being located in the display area; wherein the pixel units respectively comprise a plurality of sub-pixels; and the sub-pixels respectively comprise one of the light emitting devices and one of the pixel circuits;
wherein the pixel circuits are arranged in a plurality of rows, and the pixel circuits in at least two of adjacent sub-pixels in a same row share one of the voltage control circuits.

2. The array substrate according to claim 1, wherein all the pixel circuits in a same row share one of the voltage control circuits.

3. The array substrate according to claim 1, wherein the voltage control circuits respectively comprise: a first switching transistor; and
a gate of the first switching transistor is configured to receive a reset control signal, a first electrode of the first switching transistor is configured to receive an initialization signal, and a second electrode of the first switching transistor is coupled with first electrodes of corresponding driving transistors.

4. The array substrate according to claim 3, wherein the voltage control circuits respectively further comprise: a second switching transistor; and
a gate of the second switching transistor is configured to receive a light emitting control signal, a first electrode of the second switching transistor is configured to receive a first power signal, and a second electrode of the second switching transistor is coupled with the first electrodes of corresponding driving transistors.

5. The array substrate according to claim 1, wherein the pixel circuits respectively further comprise: a third switching transistor and a storage capacitor;
a gate of the third switching transistors is configured to receive a first gate scanning signal and is coupled with a first gate driving circuit, a first electrode of the third switching transistor is configured to receive a data signal, and a second electrode of the third switching transistor is coupled with a gate of a corresponding driving transistor; and
a first end of the storage capacitor is coupled with the gate of the corresponding driving transistor, and a second end of the storage capacitor is coupled with a grounding end.

6. The array substrate according to claim 5, wherein the pixel circuits respectively further comprise: a fourth switching transistor, wherein a type of the fourth switching transistor is different from a type of the third switching transistor; and
a gate of the fourth switching transistor is configured to receive a second gate scanning signal and is coupled with a second gate driving circuit, a first electrode of the fourth switching transistor is configured to receive a data signal, and a second electrode of the fourth switching transistor is coupled with the gate of the corresponding driving transistor.

7. The array substrate according to claim 1, wherein the pixel circuits respectively further comprise: a fifth switching transistor, wherein the second electrodes of the driving transistors are coupled with corresponding light emitting devices through the fifth switching transistor; and
  a gate of the fifth switching transistor is coupled with a reference signal end, a first electrode of the fifth switching transistor is coupled with a second electrode of a corresponding driving transistor, and a second electrode of the fifth switching transistor is coupled with a corresponding light emitting device.

8. The array substrate according to claim 7, wherein the fifth switching transistor is a P-type transistor, and the reference signal end is a grounding end.

9. The array substrate according to claim 1, further comprising a plurality of light emitting control signal lines and a light emitting control circuit electrically connected with the light emitting control signal lines;
  wherein one of the light emitting control signal lines is electrically connected with the voltage control circuit electrically connected with one row of pixel circuits and is configured to input the light emitting control signals to the electrically connected voltage control circuit.

10. The array substrate according to claim 9, wherein the light emitting control circuit comprise a plurality of cascaded light emitting shift registers, and the light emitting shift registers are electrically connected with one of the light emitting control signal lines respectively.

11. The array substrate according to claim 9, further comprising: one first power signal line;
  wherein the first power signal line is electrically connected with the voltage control circuits and is configured to input the first power signal to the voltage control circuits.

12. The array substrate according to claim 9, further comprising: a plurality of first power signal lines;
  wherein one of the light emitting control signal lines is electrically connected with the voltage control circuit electrically connected with one row of pixel circuits and is configured to input the first power signal to electrically connected voltage control circuit.

13. An organic light emitting display panel, comprising the array substrate according to claim 1.

14. A display device, comprising the organic light emitting display panel according to claim 13.

15. A driving method for the array substrate according to claim 1, comprising: controlling voltage control circuits and pixel circuits to drive light emitting devices to work within one-frame display time, wherein
  driving one row of light emitting devices to work comprises:
  in a reset stage, outputting, by the voltage control circuits, initialization signals to first electrodes of driving transistors in response to reset control signals so as to control corresponding light emitting devices to be reset;
  in a data writing stage, outputting data signal to gates of the driving transistors; and
  in a light emitting stage, outputting, by the voltage control circuits, first power signals to the first electrodes of the driving transistors in response to light emitting control signals so as to drive the light emitting devices to emit light.

16. The driving method according to claim 15, wherein after the light emitting stage, the driving one row of light emitting devices to work further comprises: a non-light-emitting stage; and
  in the non-light-emitting stage, disconnecting, by the voltage control circuits, the first power signals from the first electrodes of the driving transistors in response to the light emitting control signals so as to control the corresponding pixel circuits to drive the connected light emitting devices to stop emitting light.

17. The driving method according to claim 16, wherein non-light-emitting stages of driving rows of light emitting devices to work are started at a same time within the one-frame display time,
  or
  non-light-emitting stages of driving rows of light emitting devices to work are sequentially started row by row within the one-frame display time.

18. The driving method according to claim 15, wherein after the light emitting stage, the driving one row of light emitting devices to work further comprises: a dimming stage; the dimming stage comprises: at least one non-light-emitting stage and at least one light emitting stage, wherein the non-light-emitting stage and the light emitting stage are sequentially and alternately arranged;
  in the non-light-emitting stage, disconnecting, by the voltage control circuits, the first power signals from the first electrodes of the driving transistors in response to the light emitting control signals so as to control the corresponding pixel circuits to drive the connected light emitting devices to stop emitting light; and
  in the light emitting stage, outputting, by the voltage control circuits, the first power signals to the first electrodes of the driving transistors in response to the light emitting control signals so as to control the corresponding pixel circuits to drive the connected light emitting devices to emit light.

19. The driving method according to claim 18, wherein dimming stages of driving rows of light emitting devices to work are started at a same time within the one-frame display time,
  or
  dimming stages of driving rows of light emitting devices to work are sequentially started row by row within the one-frame display time.

* * * * *